(12) United States Patent
Soer et al.

(10) Patent No.: US 8,817,237 B2
(45) Date of Patent: Aug. 26, 2014

(54) SPECTRAL PURITY FILTER, LITHOGRAPHIC APPARATUS, AND METHOD FOR MANUFACTURING A SPECTRAL PURITY FILTER

(75) Inventors: Wouter Anthon Soer, Nijmegen (NL); Martin Jacobus Johan Jak, Eindhoven (NL); Ronald Dekker, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 266 days.

(21) Appl. No.: 13/392,434

(22) PCT Filed: Jul. 21, 2010

(86) PCT No.: PCT/EP2010/060536
§ 371 (c)(1),
(2), (4) Date: Feb. 24, 2012

(87) PCT Pub. No.: WO2011/023470
PCT Pub. Date: Mar. 3, 2011

(65) Prior Publication Data
US 2012/0154778 A1 Jun. 21, 2012

Related U.S. Application Data

(60) Provisional application No. 61/237,610, filed on Aug. 27, 2009.

(51) Int. Cl.
*G03B 27/32* (2006.01)
*G03B 27/72* (2006.01)
*G03F 7/20* (2006.01)
*G21K 1/10* (2006.01)
*G02B 5/18* (2006.01)

(52) U.S. Cl.
CPC .............. *G03F 7/70575* (2013.01); *G21K 1/10* (2013.01); *G02B 5/1809* (2013.01)
USPC ............................................. 355/77; 355/71

(58) Field of Classification Search
CPC ... G03F 7/70575; G03F 7/70995; G21K 1/10; G02B 5/1809
USPC ........................ 355/67, 71, 77; 359/359–361; 250/504 R, 515.1
See application file for complete search history.

(56) References Cited

U.S. PATENT DOCUMENTS

| | | | |
|---|---|---|---|
| 3,936,329 A | 2/1976 | Kendall et al. | |
| 5,645,684 A | 7/1997 | Keller | |

(Continued)

FOREIGN PATENT DOCUMENTS

| | | |
|---|---|---|
| CN | 1841098 | 10/2006 |
| WO | 96/41368 A1 | 12/1996 |

OTHER PUBLICATIONS

International Search Report for PCT International Patent Application No. PCT/EP2010/060536, mailed Nov. 16, 2012.

(Continued)

*Primary Examiner* — Hung Henry Nguyen
(74) *Attorney, Agent, or Firm* — Pillsbury Winthrop Shaw Pittman LLP

(57) ABSTRACT

A method of forming a spectral purity filter having a plurality of apertures configured to transmit extreme ultraviolet radiation and suppress transmission of a second type of radiation, in which trenches are formed in a base material in a pattern corresponding to the walls to be formed between the apertures. The trenches are filled with a grid material to form walls of the grid material, and the base material is selectively removed until the grid material is exposed and forms the spaces between the walls of the grid material for the apertures.

12 Claims, 6 Drawing Sheets

(56) References Cited

U.S. PATENT DOCUMENTS

| | | | |
|---|---|---|---|
| 6,044,981 A * | 4/2000 | Chu et al. | 210/490 |
| 6,566,251 B2 * | 5/2003 | Allen et al. | 438/639 |
| 7,250,620 B2 * | 7/2007 | Wurm et al. | 250/504 R |
| 7,372,623 B2 | 5/2008 | Banine et al. | |
| 2006/0146413 A1 | 7/2006 | Klunder et al. | |
| 2006/0221440 A1 | 10/2006 | Banine et al. | |
| 2007/0170379 A1 | 7/2007 | Watson et al. | |

OTHER PUBLICATIONS

Soer et al., "Grid spectral purity filters for suppression of infrared radiation in laser-produced plasma EUV sources";—& Proceedings of SPIE—The International Society for Optical Engineering—Alternative Lithographic Technologies 2009 SPIE USA, vol. 7271, Feb. 24, 2009, pp. 72712Y-1-72712Y-9.

* cited by examiner

SPECTRAL PURITY FILTER, LITHOGRAPHIC APPARATUS, AND METHOD FOR MANUFACTURING A SPECTRAL PURITY FILTER

CROSS-REFERENCE TO RELATED APPLICATIONS

This application is the United States national phase entry of PCT/EP2010/060536, filed Jul. 21, 2010, which claims the benefit of priority from U.S. provisional application 61/237,610, which was filed on 27 Aug. 2009, the contents of both of which are incorporated herein in their entireties by reference.

FIELD

The present invention relates to spectral purity filters, lithographic apparatus including such spectral purity filters, and methods for manufacturing spectral purity filters.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A key factor limiting pattern printing is the wavelength $\lambda$ of the radiation used. In order to be able to project ever smaller structures onto substrates, it has been proposed to use extreme ultraviolet (EUV) radiation which is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such EUV radiation is sometimes termed soft x-ray. Possible sources include, for example, laser-produced plasma sources, discharge plasma sources, or synchrotron radiation from electron storage rings.

EUV sources based on a tin (Sn) plasma do not only emit the desired in-band EUV radiation but also out-of-band radiation, most notably in the deep UV (DUV) range (100-400 nm). Moreover, in the case of Laser Produced Plasma (LPP) EUV sources, the infrared radiation from the laser, usually at 10.6 μm, presents a significant amount of unwanted radiation. Since the optics of the EUV lithographic system generally have substantial reflectivity at these wavelengths, the unwanted radiation propagates into the lithography tool with significant power if no measures are taken.

In a lithographic apparatus, out-of-band radiation should be minimized for several reasons. Firstly, resist is sensitive to out-of-band wavelengths, and thus the image quality may be deteriorated. Secondly, unwanted radiation, especially the 10.6 μm radiation in LPP sources, leads to unwanted heating of the mask, wafer and optics. In order to bring unwanted radiation within specified limits, spectral purity filters (SPFs) are being developed.

Spectral purity filters can be either reflective or transmissive for EUV radiation. Implementation of a reflective SPF requires modification of an existing minor or insertion of an additional reflective element. A transmissive SPF is typically placed between the collector and the illuminator and, in principle at least, does not affect the radiation path. This may be an advantage because it results in flexibility and compatibility with other SPFs.

Grid SPFs form a class of transmissive SPFs that may be used when the unwanted radiation has a much larger wavelength than the EUV radiation, for example in the case of 10.6 μm radiation in LPP sources. Grid SPFs contain apertures with a size of the order of the wavelength to be suppressed. The suppression mechanism may vary among different types of grid SPFs as described in the prior art and detailed embodiments further in this document. Since the wavelength of EUV radiation (13.5 nm) is much smaller than the size of the apertures (typically >3 μm), EUV radiation is transmitted through the apertures without substantial diffraction.

Several prior art spectral purity filters (SPFs) rely on a grid with micron-sized apertures to suppress unwanted radiation. U.S. Patent Application Publication 2006/0146413 discloses a spectral purity filter (SPF) comprising an array of apertures with diameters up to 20 μm.

Depending on the size of the apertures compared to the radiation wavelength, the SPF may suppress unwanted radiation by different mechanisms. If the aperture size is smaller than approximately half of the (unwanted) wavelength, the SPF reflects virtually all radiation of this wavelength. If the aperture size is larger, but still of the order of the wavelength, the radiation is at least partially diffracted and may be absorbed in a waveguide inside the aperture.

The approximate material parameters and specifications for these SPFs are known. However, manufacturing is not straightforward at these specifications. The most challenging specifications are: apertures of typically 4 μm in diameter; a grid thickness of typically 5-10 μm; very thin (typically <1 μm) and parallel (non-tapered) walls between the apertures to ensure maximal EUV transmission.

Silicon has emerged as a promising material for the manufacture of such grids, using the photolithographic patterning and anisotropic etching processes that are well understood from semiconductor manufacturing. For deep apertures with a well-controlled cross-section, deep reactive ion etching (DRIE) has been found promising, although difficulties remain in providing a method of manufacturing an EUV spectral purity filter with the desired specifications.

SUMMARY

It is an aspect of the present invention to provide a method of manufacturing an EUV spectral purity filter that is relatively simple to implement and provides an EUV spectral purity filter with the desired specifications.

According to an aspect of the invention, there is provided a method of manufacturing a spectral purity filter comprising a plurality of apertures configured to transmit extreme ultraviolet radiation and suppress transmission of a second type of radiation, the method comprising: providing a base material having first and second major surfaces; forming trenches in the first surface of said base material in a pattern corresponding to walls to be formed between the apertures of the spectral purity filter; filling the trenches with a grid material to form walls of the grid material; and selectively removing at least a part of the base material until the grid material is exposed and forms spaces between the walls of the grid material to form the apertures.

The trenches may be filled with an electrically conductive material. The process for filling the trenches may include an electroplating process. The trenches may be filled with polycrystalline silicon. The process of filling the trenches with polycrystalline silicon may include a Low-Pressure Chemical Vapor Deposition (LPCVD) or Plasma-Enhanced Chemical Vapor Deposition (PECVD) process. The forming the trenches may be configured such that the trenches have a depth in the range of from 2 μm and 10 μm and/or a width less than 1 μm. Preferably, but not necessarily, the trenches have a ratio of depth to width in the range of between 5:1 and 20:1.

According to an aspect of the invention, there is provided a spectral purity filter manufactured according to the method above.

According to an aspect of the invention, there is provided a spectral purity filter comprising a plurality of interlinked walls within a first region of the spectral purity filter, the walls defining a plurality of apertures through the spectral purity filter, the plurality of apertures configured to transmit extreme ultraviolet radiation and suppress transmission of a second type of radiation; and a support frame, in a second region of the spectral purity filter that is adjacent the first region, the support frame configured to support the walls; wherein the material from which the interlinked walls are formed extends into one or more openings in the support frame in order to provide a mechanical connection between the support frame and the interlinked walls. The support frame may be formed from a first material, such as monocrystalline silicon, and the interlinked walls may be formed from a second material different from the first material. The second material may, for instance, be a metal or polycrystalline silicon. In the openings in the support frame into which the second material of the walls extends, a layer of a third material, different from the first and second materials, may separate the first material of the support frame from the second material.

According to an aspect of the invention, there is provided a radiation source and a lithographic apparatus comprising a spectral purity filter as above.

According to an aspect of the invention, there is provided a radiation source that includes a spectral purity filter comprising a plurality of apertures configured to transmit extreme ultraviolet radiation and suppress transmission of a second type of radiation; a plurality of interlinked walls within a first region of the spectral purity filter, the walls defining a plurality of apertures through the spectral purity filter; and a support frame, in a second region of the spectral purity filter that is adjacent the first region, the support frame configured to support the walls. The material from which the interlinked walls are formed extends into one or more openings in the support frame in order to provide a mechanical connection between the support frame and the interlinked walls.

According to an aspect of the invention, there is provided a lithographic apparatus that includes a radiation source configured to generate extreme ultraviolet radiation and a second type of radiation, and a spectral purity filter comprising a plurality of interlinked walls within a first region of the spectral purity filter, the walls defining a plurality of apertures through the spectral purity filter, the plurality of apertures configured to transmit the extreme ultraviolet radiation and suppress transmission of the second type of radiation, and a support frame, in a second region of the spectral purity filter that is adjacent the first region, the support frame configured to support the walls. The material from which the interlinked walls are formed extends into one or more openings in the support frame in order to provide a mechanical connection between the support frame and the interlinked walls. The apparatus also includes a support configured to support a patterning device, the patterning device being configured to pattern the extreme ultraviolet radiation, and a projection system configured to project the patterned radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
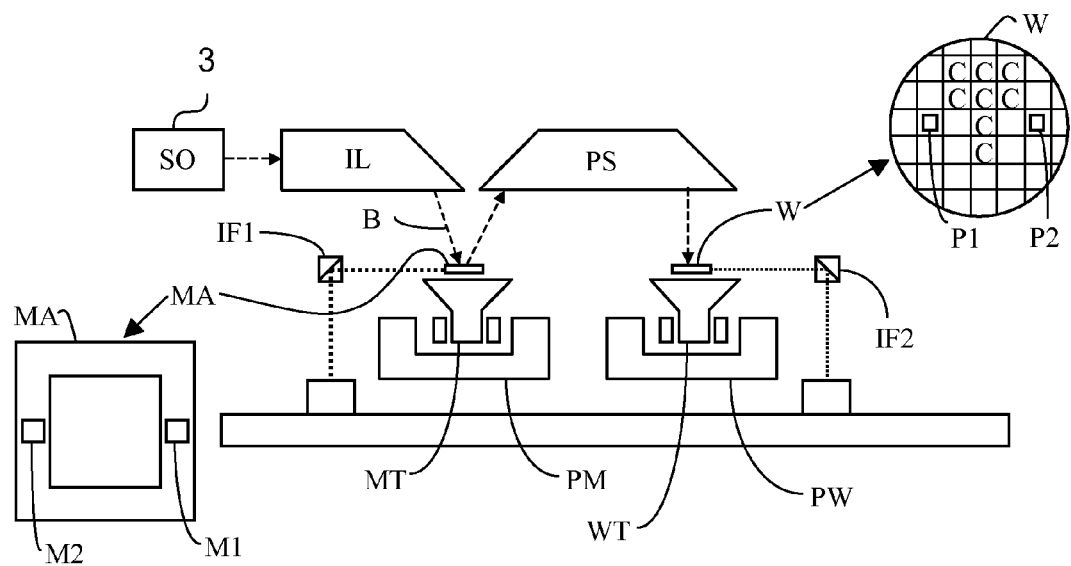
FIG. 1 depicts a lithographic apparatus according to an embodiment of the invention.

FIG. 1 schematically depicts a lithographic apparatus according to an embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Present proposals for EUV lithography employ reflective patterning devices as shown in FIG. 1. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

Any use of the term "projection lens" herein may be considered as synonymous with the more general term "projection system". For EUV wavelengths, transmissive materials are not readily available. Therefore "lenses" for illumination and projection in an EUV system will generally be of the reflective type, that is to say, curved mirrors.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing minors and/or a beam expander.

In other cases the source may be an integral part of the lithographic apparatus, for example when the source is a mercury lamp. The source SO and the illuminator IL, together with the beam delivery system if required, may be referred to as a radiation system.

The illuminator IL may comprise an adjusting device (adjuster) configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
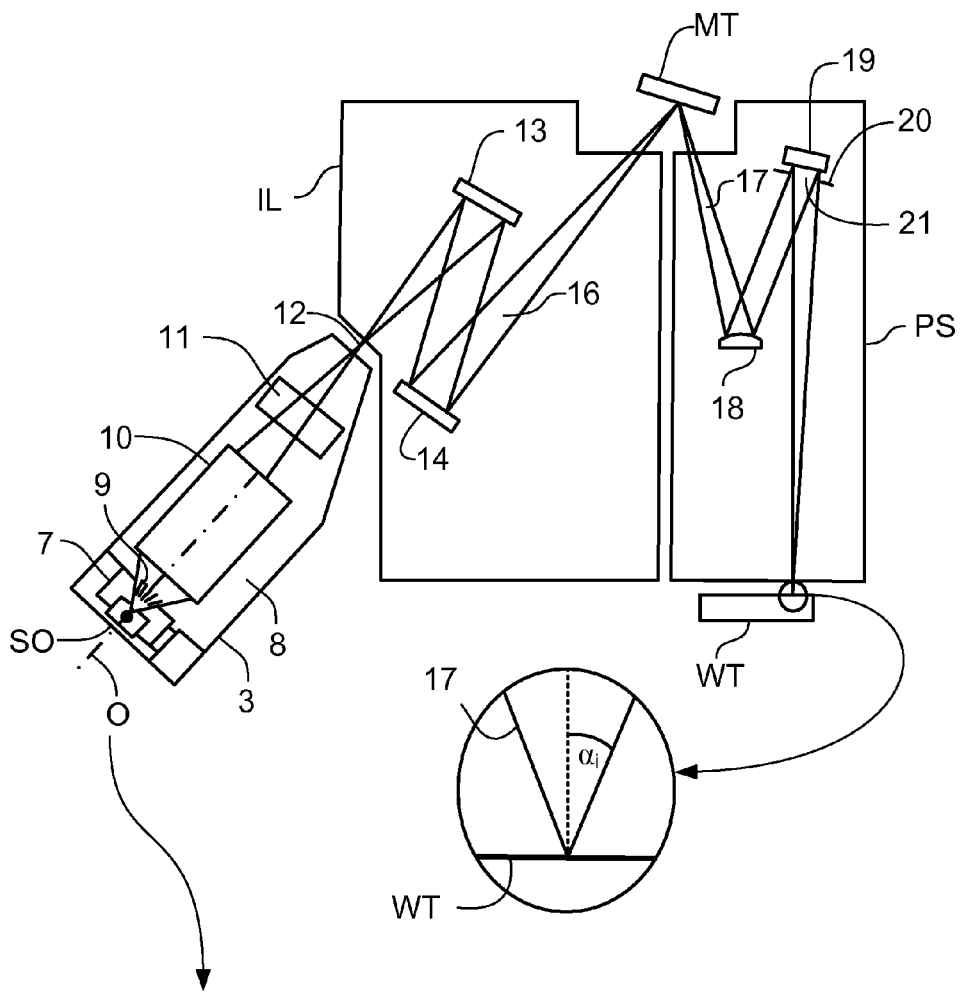
FIG. 2 depicts the layout of a lithographic apparatus according to an embodiment of the present invention.
Figure 2:
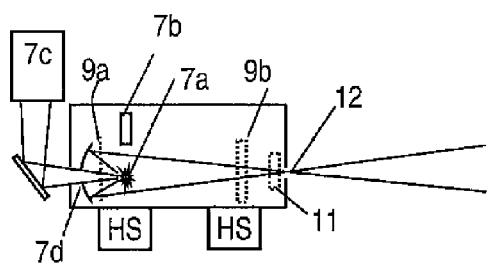

FIG. 2 depicts a schematic side view of a practical EUV lithographic apparatus. It will be noted that, although the physical arrangement is different to that of the apparatus shown in FIG. 1, the principle of operation is similar. The apparatus includes a source-collector-module or radiation unit 3, an illumination system IL and a projection system PS. Radiation unit 3 is provided with a radiation source 7, SO which may employ a gas or vapor, such as for example Xe gas or a vapor of Li, Gd or Sn in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of, for example, 10 Pa 0.1 mbar of Xe, Li, Gd, Sn vapor or any other suitable gas or vapor may be desired for efficient generation of the radiation. In an embodiment, a Sn source as EUV source is applied.

The main part of FIG. 2 illustrates radiation source 7 in the form of a discharge-produced plasma (DPP). The alternative detail at lower left in the drawing illustrates an alternative form of source, using a laser-produced plasma (LPP). In the LPP type of source, an ignition region 7a is supplied with plasma fuel, for example droplets of molten Sn, from a fuel delivery system 7b. A laser beam generator 7c and associated optical system deliver a beam of radiation to the ignition region. Generator 7c may be a $CO_2$ laser having an infrared wavelength, for example 10.6 micrometer or 9.4 micrometer. Alternatively, other suitable lasers may be used, for example having respective wavelengths in the range of 1-11 micrometers. Upon interaction with the laser beam, the fuel droplets are transferred into plasma state which may emit, for example, 6.7 nm radiation, or any other EUV radiation selected from the range of 5-20 nm. EUV is the example of concern here, though a different type of radiation may be generated in other applications. The radiation generated in the plasma is gathered by an elliptical or other suitable collector 7d to generate the source radiation beam having intermediate focus 12.

Returning to the main part of FIG. 2, the radiation emitted by radiation source SO is passed from the DPP source chamber 7 into collector chamber 8 via a contaminant trap 9 in the form of a gas barrier or "foil trap". This will be described further below. Collector chamber 8 may include a radiation collector 10 which is, for example, a grazing incidence collector comprising a nested array of so-called grazing incidence reflectors. Radiation collectors suitable for this purpose are known from the prior art. The beam of EUV radiation emanating from the collector 10 will have a certain angular spread, perhaps as much as 10 degrees either side of optical axis O. In the LPP source shown at lower left, a normal incidence collector 7d is provided for collecting the radiation from the source.

Radiation passed by collector 10 transmits through a spectral purity filter 11 according to embodiments of the present invention. It should be noted that in contrast to reflective grating spectral purity filters, the transmissive spectral purity filter 11 does not change the direction of the radiation beam. Embodiments of the filter 11 are described below. The radiation is focused in a virtual source point 12 (i.e. an intermediate focus) from an aperture in the collection chamber 8. From chamber 8, the radiation beam 16 is reflected in illumination system IL via normal incidence reflectors 13,14 onto a reticle or mask positioned on reticle or mask table MT. A patterned beam 17 is formed which is imaged by projection system PS via reflective elements 18,19 onto wafer W mounted wafer stage or substrate table WT. More elements than shown may generally be present in the illumination system IL and projection system PS. One of the reflective elements 19 has in front of it an NA disc 20 having an aperture 21 there-through. The size of the aperture 21 determines the angle $\alpha_i$ subtended by the patterned radiation beam 17 as it strikes the substrate table WT.

FIG. 2 shows the spectral purity filter 11 positioned closely upstream of the virtual source point 12. In alternative embodiments, not shown, the spectral purity filter 11 may be positioned at the virtual source point 12 or at any point between the collector 10 and the virtual source point 12. The filter can be placed at other locations in the radiation path, for example downstream of the virtual source point 12. Multiple filters can be deployed.

The gas barrier includes a channel structure such as, for instance, described in detail in U.S. Pat. Nos. 6,614,505 and 6,359,969, which are incorporated herein by reference. The purpose of this contaminant trap is to prevent or at least reduce the incidence of fuel material or by-products impinging on the elements of the optical system and degrading their performance over time. These elements include the collector 10 and the spectral purity filter 11. In the case of the LPP source shown in detail at bottom left of FIG. 2, the contaminant trap includes a first trap arrangement 9a which protects the elliptical collector 7d, and optionally further trap arrangements, such as shown at 9b. The gas barrier may act as a physical barrier (by fluid counter-flow), by chemical interaction with contaminants and/or by electrostatic or electromagnetic deflection of charged particles. In practice, a combination of these methods are employed to permit transfer of the radiation into the illumination system, while blocking the plasma material to the greatest extent possible. As explained in the above-mentioned United States patents, hydrogen radicals in particular may be injected for chemically modifying the Sn or other plasma materials.

Hydrogen radicals can also be applied for cleaning of Sn and other contaminants which may already be deposited on the optical surfaces. Further, hydrogen gas may be deployed in the vicinity of the wafer support WT, as a buffer against contaminants from the wafer entering the larger vacuum spaces within the system. In a vacuum environment, typical photoresist materials, not to mention components of the supports and positioning systems, tend to release organic and other gaseous materials which could contaminate the optical components over time.

For all these purposes, hydrogen sources HS are shown deployed for the supplying hydrogen gas to each contaminant trap arrangement 9a, 9b, and at ports to the chambers of the illumination system IL and projection system PS. Some sources may supply molecular hydrogen gas ($H_2$) as a simple buffer while others generate H radicals. The molecular hydrogen which permeates the vacuum environment can become radicalized by radiation, electric discharge and so forth in the environment.

Figure 3:
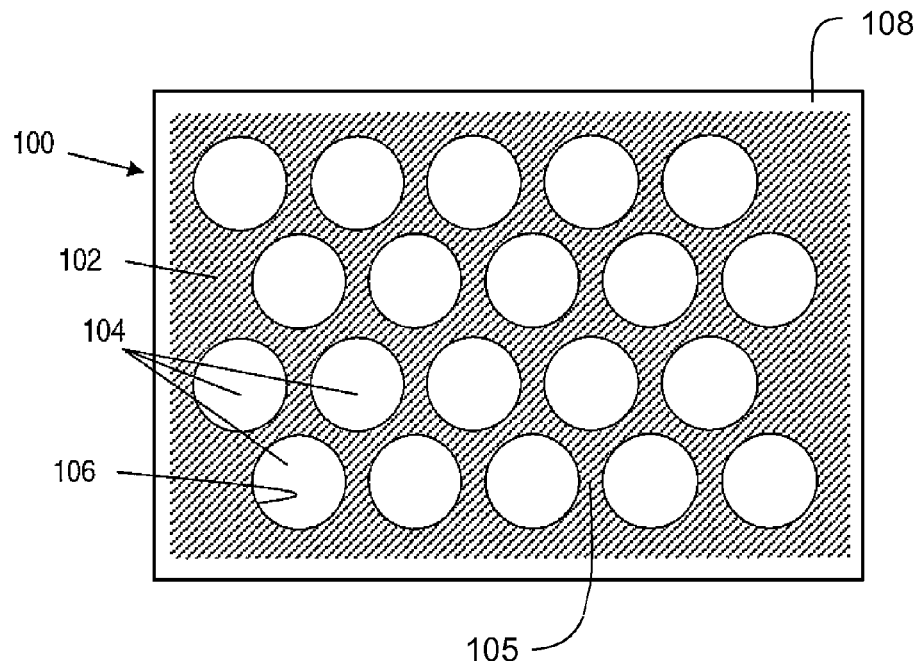
FIG. 3 depicts a front view of a spectral purity filter according to an embodiment of the present invention.

FIG. 3 is a schematic front face view of an embodiment of a spectral purity filter 100, that may for example be applied as an above-mentioned filter 11 of a lithographic apparatus. The present filter 100 is configured to transmit extreme ultraviolet (EUV) radiation. In a further embodiment, the filter 100 substantially blocks a second type of radiation generated by a radiation source, for example infrared (IR) radiation, for example infrared radiation of a wavelength larger than about 1 μm, particularly larger than about 10 μm. Particularly, the EUV radiation to be transmitted and the second type of radiation (to be blocked) can emanate from the same radiation source, for example an LPP source SO of a lithographic apparatus.

The spectral purity filter 100 in the embodiments to be described comprises a substantially planar filter part 102 (for example a filter film or filter layer) in a first region of the spectral purity filter. The filter part 102 as such can be called a 'filter substrate'. The filter part 102 has a plurality of (preferably parallel) apertures 104 to transmit the extreme ultraviolet radiation and to suppress transmission of the second type of radiation. The face on which radiation impinges from the source SO may be referred to as the front face, while the face from which radiation exits to the illumination system IL may be referred to as the rear face. As is mentioned above, for example, the EUV radiation can be transmitted by the spectral purity filter without changing the direction of the radiation. In an embodiment, each aperture 104 has parallel sidewalls defining the apertures 104 and extending completely from the front face to the rear face.

The spectral purity filter 100 may include a support frame 108 in a second region of the spectral purity filter that is adjacent the first region. The support frame 108 may be configured to provide structural support for the filter part 102. The support frame 108 may include members for mounting the spectral purity filter 100 to an apparatus in which it is to be used. In a particular arrangement, the support frame 108 may surround the filter part 100.

Figure 4:
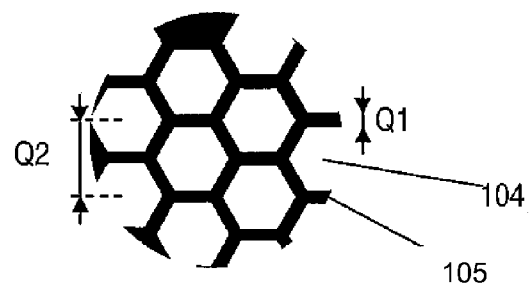
FIG. 4 depicts a detail of a variation of a spectral purity filter according to an embodiment of the present invention.
Figure 5:
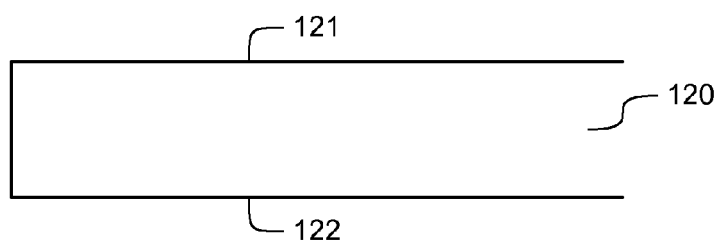
FIGS. 5 to 13 depict stages in the manufacture of a spectral purity filter according to an embodiment of the present invention.
Figure 6:
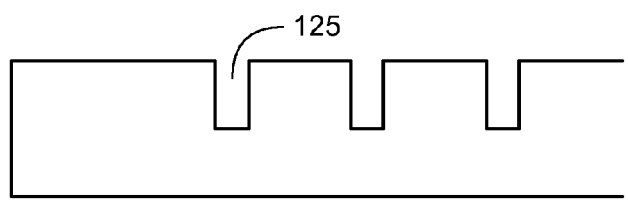

The filter 100 may include a freestanding thin film of Silicon (Si) 102 and an array of apertures 104 with substantially vertical (i.e. perpendicular to the film surface) sidewalls 106. The diameter of the apertures 104 is desirably larger than about 100 nm and more desirably larger than about 1 μm in order to allow EUV radiation to pass through the spectral purity filter 100 without substantial diffraction. Although the apertures 104 are shown schematically as having a circular cross section (in FIG. 3), other shapes are also possible, and can be preferred. For example, hexagonal apertures, as shown in FIG. 4 may be advantageous from the point of view of mechanical stability. A wavelength to be suppressed by the filter 100 can be at least 10× the EUV wavelength to be transmitted. Particularly, the filter 100 may be configured to suppress transmission of DUV radiation (having a wavelength in the range of about 100-400 nm), and/or infrared radiation having a wavelength larger than 1 μm (for example in the range of 1-11 microns).

According to an embodiment of the invention, manufacture of the spectral purity filter 100 may include an anisotropic etching method, of which a suitable example is the technique of deep reactive ion etching (DRIE), described briefly below. DRIE is an etching method with highly anisotropic etch rates, which enables the manufacturing of vertical etch profiles in Si using the so-called Bosch process. This is described for example in S. Tachi, K. Tsujimoto, S. Okudaira, Low-temperature reactive ion etching and microwave plasma etching of silicon, Appl. Phys. Lett. 52 (1988), 616. The Bosch process consists of alternately exposing the Si surface to an $SF_6$ plasma and a fluorocarbon (e.g. $C_4F_8$) plasma. In the first stage, silicon is etched in a more or less isotropic way, whereas in the second stage, the etched profile is covered by a passivation layer. In the next etch, this passivation layer is opened preferentially at the bottom, mainly by ion bombardment, and etching starts again. By repetition of the etch/passivation cycle, the etch proceeds layer by layer downwards into the silicon surface, without lateral spreading.

According to an embodiment, EUV radiation is directly transmitted through the apertures 104, preferably utilizing a relatively thin filter 100, in order to keep the aspect ratio of the apertures low enough to allow EUV transmission with a significant angular spread. The thickness of the filter part 102 (i.e. the length of each of the apertures 104) is, for example, smaller than about 20 μm, for example in the range of about 2 μm to about 10 μm, for example the range of about 5 μm to about 10 μm. Also, according to an embodiment, each of the apertures 104 may have a diameter in the range of about 100 nm to about 10 μm. The apertures 104 may, for example, each have diameter in the range of about 1.5 μm to about 6 μm, for example the range of about 2 μm to about 4 μm.

The thickness Q1 of the walls 105 between the filter apertures 104 may be smaller than 1μm, for example in the range of about 0.4 μm to about 0.6 μm, particularly about 0.5 μm. In general, the aspect ratio of the apertures, namely the ratio of the filter part 102 to the thickness of the walls between the filter apertures 104, may be in the range of from 5:1 to 20:1. The apertures of the EUV transmissive filter 100 may have a period Q2 (indicated in FIG. 4) of in the range of about 3 μm to about 6 μm, particularly about 3 μm to about 4 μm, for example about 4 μm. Consequently, the apertures may provide an open area of about 70-80% of a total filter front surface.

The filter 100 may be configured to provide at most 5% infrared light (IR) transmission. Also, the filter 100 may be configured to transmit at least 60% of incoming EUV radiation at a normal incidence. Furthermore, the filter 100 may provide at least about 40% of transmission of EUV radiation having an angle of incidence (with respect of a normal direction) of about 10°.

In an embodiment, a method of manufacturing a spectral purity filter as specified above is provided. In general, the method comprises forming trenches in a base material, for example etching the trenches in a wafer of monocrystalline silicon and using the trenches as a mold to form the grid of walls of the spectral purity filter. For example, once the trenches are formed, the trenches may be filled with a grid material, such as polycrystalline silicon before the remainder of the base material is removed, leaving only the walls formed of the grid material, having the shape defined by the original trenches. Accordingly, the accuracy of the formation of the grid of walls of the spectral purity filter, namely the walls 105 separating the apertures of the spectral purity filter, is determined by the accuracy of formation of the trenches in the base material. Techniques for forming well-defined trenches in monocrystalline silicon by etching are well-known and it is possible to accurately provide a desired arrangement of such trenches with the desired dimensions and aspect ratios of the walls of the spectral purity filter grid discussed above.

FIGS. 5 to 13 depict an example of the series of steps that may be performed according to an embodiment of the invention in order to form a spectral purity filter 100 as specified above. As shown, the process commences with a section of the base material 120 that is at least the size of the spectral purity filter 100 to be formed. For example, the base material may be a wafer of monocrystaline silicon as discussed above. The base material 120 has first and second major surfaces 121, 122.

In a first step, trenches 125 are formed in the first surface 121 of the base material 120. As shown, the trenches 125 formed in the first surface 121 of the base material 120 do not extend through the base material 120 to the second surface 122. The trenches 125 correspond to the walls to be formed between the apertures 104 in the spectral purity filter. Accordingly, the trenches 125 may be arranged in substantially the same pattern as the walls between the apertures 104 of the spectral purity filter 100 to be formed and may have substantially the same dimensions. In particular, the width of the trenches 125 may substantially correspond to the thickness of the walls between the filter apertures 104 and the depth of the trenches 125 may substantially correspond to the thickness of the filter part 102 of the spectral purity filter 100.

The trenches 125 in the first surface 121 of the base material 120 may be formed, for example, by forming a protective mask on the first surface 121 of the base material 120 in the regions in which the trenches 125 are not to be formed, for example by lithographic patterning. Subsequently, the trenches 125 may be formed in the areas not protected by the mask by a process such as deep reactive-ion etching, as discussed above. It will be appreciated, however, that other etching processes may be used, in particular other anisotropic etching processes. Wet chemical etching, for example using KOH etch, may be used to etch the trenches 125 in a [110] oriented silicon wafer.

Figure 7:
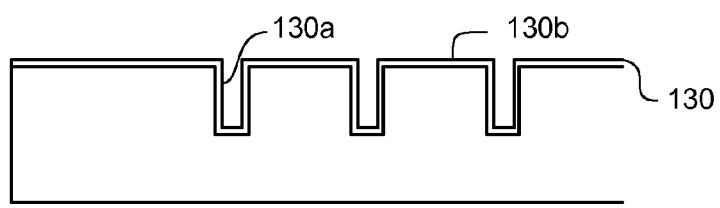

As shown in FIG. 7, the surface of the trenches may then be coated with an etch stop layer 130, namely a layer of material that is resistant to a particular etching process. In this case, the etch stop layer 130 should be selected to be resistant to the etching process that is subsequently used to remove portions of the base material 120, as described below. For example, the etch stop layer 130 may be $SiO_2$. The etch stop layer may in particular provide a covering 130a on the surface of the trenches 125 in the first surface 121 of the base material 120. In addition, the etch stop layer 130 may provide a coating 130b on the portions of the first surface 121 of the base material 120 between and around the trenches 125.

The etch stop layer 130 may be a thermally grown oxide or, for example, silicon nitride, which can be deposited using a Low-Pressure Chemical Vapour Deposition (LPCVD) process or a Plasma-Enhanced Chemical Vapour Deposition (PECVD) process. Such methods for forming the etch stop layer 130 may be beneficial because they provide good step coverage, namely provide suitable covering for the side walls and into the trenches. Alternatively, other deposition processes, such as sputter deposition may be used, for example if a different material is desired to be used as the etch stop layer 130.

Figure 8:
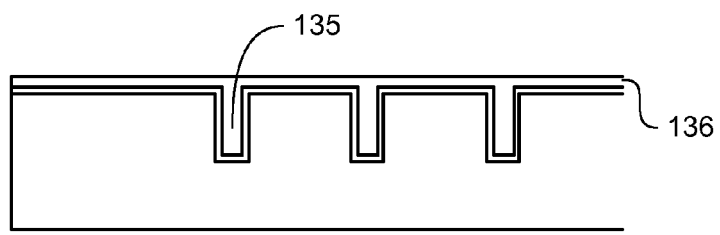

As shown in FIG. 8, the trenches 125 are then filled with an appropriate material 135 to form the walls between the apertures 104 of the spectral purity filter 100. For example, the trenches 125 may be filled with polycrystalline silicon, for example using a Low-Pressure Chemical Vapor Deposition (LPCVD) process or a Plasma-Enhanced Chemical Vapor Deposition (PECVD) process. It will be appreciated that the final dimension of the walls between the apertures 104 of the spectral purity filter 100 will correspond to the dimensions of the trenches 125 including the coating 130a of the etch stop layer 130, when used. In that case, the trenches 125 initially formed in the first surface 121 of the base material 120 may be formed with dimensions such that the resulting dimensions of the trenches once covered by the coating 130a of the etch stop layer have precisely the desired dimensions of the walls between the apertures 104.

Figure 9:
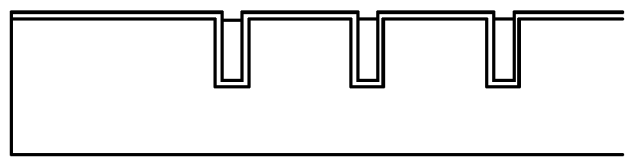

During the process to fill the trenches with the grid material 135, a layer 136 of the grid material may form across the entirety of the first surface 121 of the base material 120. This excess grid material layer 136 may be removed, for example, by reactive-ion etching or another suitable process as shown in FIG. 9.

Figure 10:
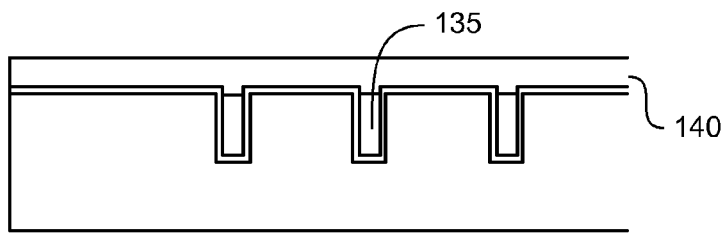

As shown in FIG. 10, a protective layer 140 may subsequently be applied to the first surface 121 of the base material 120 in order to prevent damage to the grid material 135 during the subsequent processing steps. The protective layer 140 may, for example, be polyimide. However, it will be appreciated that other suitable materials may also be used.

Figure 11:
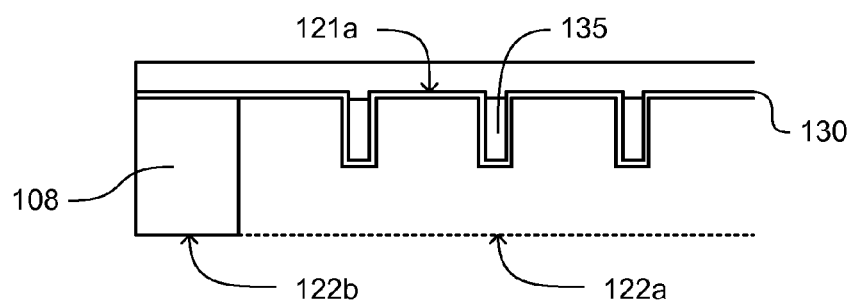

As shown in FIG. 11, the base material 120 may then be removed from the second surface 122. In particular, the base material 120 may be selectively removed from a first region 122a of the second surface 122, corresponding to a first region 121a of the first surface 121 of the base material 120 in which the apertures 104 of the spectral purity filter 100 are to be formed.

The base material 120 may not be removed from a second region 122b of the second surface 122 that is adjacent to the first region 122a. The base material 120 that is not removed may provide the support frame 108 discussed above.

As shown in FIG. 11, the process used to remove the base material 120 from the second side 122 is stopped by the etch stop layer 130, which surrounds the grid material 135 and prevents the grid material 135 from also being removed. The process may be performed by forming a mask on the second region 122b of the second surface 122 of the base material 120, for example using lithographic processes as discussed above, and subsequently using a reactive-ion etching process in order to remove the base material 120 from the first region 122a of the second surface 122. It will be appreciated that other etching processes may also be used but as discussed above, in that case, a different etch stop layer 130 may be required. The base material 120 may be removed using wet chemical etching, for example using KOH etch. In this case, the etch stop layer 130 may be silicon nitride.

Figure 12:
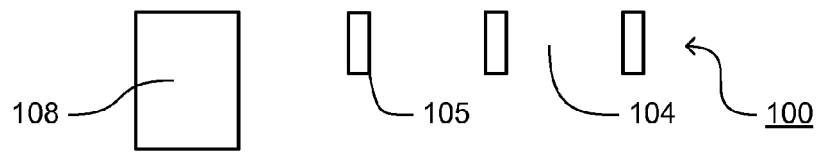

Finally, as depicted in FIG. 12, the etch stop layer 130 and the protective layer 140, if used, may be removed, for example by plasma etching or by another suitable process, leaving the spectral purity filter 100 comprising the grid material 135 forming the desired walls 105 between the apertures 104 in the spectral purity filter 100 and the support frame 108. The etch stop layer 130 and the protective layer 140, if used, may be removed by wet chemical etching. For example HF may be used to remove silicon nitride, if used.

It will be appreciated that the above described example of the processes for forming a spectral purity filter according to the invention may be varied and/or additional processing steps may be included.

Figure 13:
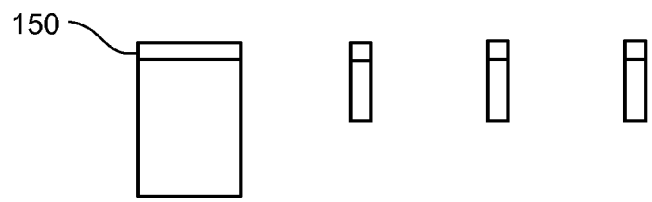

For example, as depicted in FIG. 13, at least one surface of the spectral purity filter 100 may be coated with an additional layer 150 that is selected to improve the reflectivity of the surface on which the radiation is to be incident to the radiation of the second type, namely the radiation for which transmission is to be minimized. For example, a thin metal layer 150 may be applied in order to increase the reflectivity to infrared radiation.

In an alternative or additional variation, the grid material 135 may be made of a metal, for example molybdenum or another conductive material, for example TiN. In this case, the walls 105 of the spectral purity filter 100 between the apertures 104 may be intrinsically reflective to radiation such as infrared radiation. In that case it may not be necessary to form an additional reflective layer on the spectral purity filter. Desirably, the material is selected to have a thermal expansion close to that of silicon, which forms the support frame 108.

If the grid material is an electrically conductive material, the trenches 135 may be filled by depositing the material using an electroplating process. In order to perform this process, a plating base coating may first be applied to the base of the trenches. Alternatively, the base material 120 may be highly-doped silicon, in which case, a plating base coating may not be used.

Alternatively or additionally, the trenches 125 may be filled with the grid material 135 by means of a chemical vapour deposition process, a physical vapour deposition process, a sputter deposition process or an atomic layer deposition process.

Alternatively or additionally, the grid material 135 may be selected such that it is resistant to the etching process used to remove the base material 120. In this case, the etch stop layer 130 may not be used and, accordingly, the processes of applying and removing the etch stop layer 130 may be omitted. Likewise, depending on the other processes used, the protective layer 140 may not be used and may be omitted.

In an alternative or additional variation, the base material 120 that is removed to expose the grid material 135 to form the apertures 104, may be removed from the first surface 121 of the base material 120 instead of, or in addition to, removing the base material 120 from the second surface 122. For example, after the excess grid material layer 136 has been removed, as shown in FIG. 9, the exposed etch stop layer 130, namely the coating 130*b* on the portions of the first surface 121 of the base material 120 between and around the trenches 125 may be removed. Accordingly, the first surface 121 of the base material 120 between the trenches 125 filled with the grid material 135 may be exposed and subsequently etched. The top surface of the etch stop layer 130 may be removed, for example, by plasma etching or by another suitable process. Likewise, in the case of the example above in which the grid material 135 is selected such that it is resistant to the etching process used to remove the base material 120, it will be appreciated that the base material 120 may be removed from one or both of the first and second surfaces 121, 122 of the base material 120.

Figure 14:
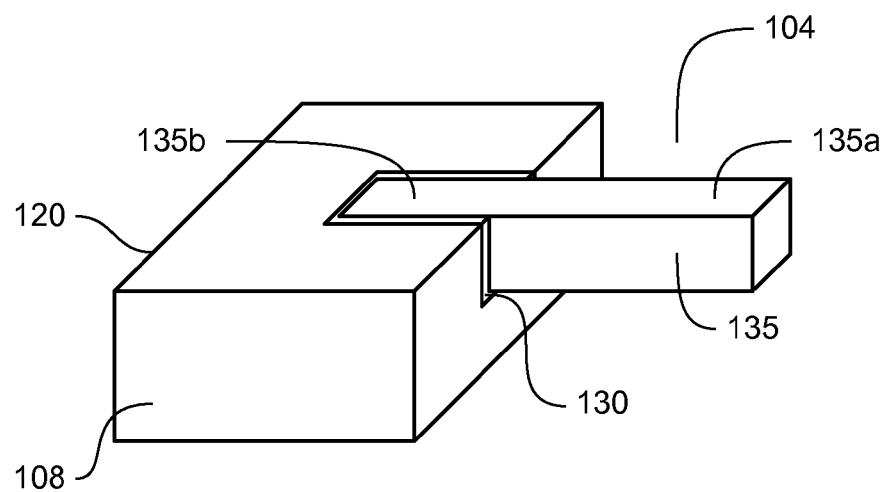
FIG. 14 depicts a detail of part of a spectral purity filter according to the present invention.

FIG. 14 depicts in detail a portion of the support frame of a spectral purity filter 100 formed according to an embodiment of the present invention. As shown, in addition to a portion 135*a* of the grid material 135 forming the walls 105 between apertures 104 of the spectral purity filter, a second portion 135*b* of the grid material 135 extends into the base material 120 forming the support frame 108, namely the base material 120 corresponding to the second region 122*b* of the second surface 122 of the base material 120. Accordingly, the second portion 135*b* of the grid material 135 connects the portion 135*a* of the grid material 135 that forms the walls between the apertures 104 to the support frame 108.

It will be appreciated that, as depicted in FIG. 14, where an etch stop layer 130 has been used in the formation of the spectral purity filter, as discussed above, a layer of the etch stop material 130 may be retained at the boundary between the portion 135*b* of the grid material that extends into the support frame 108 and the base material 120 from which the support frame is formed. Accordingly, the etch stop material 130 may separate the base material 120 from the grid material 135.

It will be understood that the apparatus of FIGS. 1 and 2 incorporating the spectral purity filter may be used in a lithographic manufacturing process. Such lithographic apparatus may be used in the manufacture of ICs, integrated optical systems, guidance and detection patterns for magnetic domain memories, flat-panel displays, liquid crystal displays (LCDs), thin-film magnetic heads, etc. It should be appreciated that, in the context of such alternative applications, any use of the term "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it should be appreciated that modifications may be made to the present invention as described without departing from the scope of the claims set out below. It will be appreciated that embodiments of the invention may be used for any type of EUV source, including but not limited to a discharge produced plasma source (DPP source), or a laser produced plasma source (LPP source). However, an embodiment of the invention may be particularly suited to suppress radiation from a laser source, which typically forms part of a laser produced plasma source. This is because such a plasma source often outputs secondary radiation arising from the laser.

The spectral purity filter maybe located practically anywhere in the radiation path. In an embodiment, the spectral purity filter is located in a region that receives EUV containing radiation from the EUV radiation source and delivers the EUV radiation to a suitable downstream EUV radiation optical system, wherein the radiation from the EUV radiation source is arranged to pass through the spectral purity filter prior to entering the optical system. In an embodiment, the spectral purity filter is in the EUV radiation source. In an embodiment, the spectral purity filter is in the EUV lithographic apparatus, such as in the illumination system or in the projection system. In an embodiment, the spectral purity filter is located in a radiation path after the plasma but before the collector.

While specific embodiments of the present invention have been described above, it should be appreciated that the present invention may be practiced otherwise than as described.

What is claimed is:

1. A method of manufacturing a spectral purity filter comprising a plurality of apertures configured to transmit extreme ultraviolet radiation and suppress transmission of a second type of radiation, the method comprising:
providing a base material having first and second major surfaces;
forming trenches in the first surface of said base material in a pattern corresponding to walls to be formed between the apertures of the spectral purity filter;
filling the trenches with a grid material to form walls of the grid material; and
selectively removing at least a part of the base material until the grid material is exposed and forms spaces between the walls of the grid material to form the apertures.

2. A method of manufacturing a spectral purity filter according to claim 1, further comprising:

coating at least the surface of the trenches with a layer of material that is resistant to an etching process before filling the trenches with the grid material; and using said etching process for said selectively removing at least a part of the base material.

3. A method of manufacturing a spectral purity filter according to claim 2, further comprising using a second etching process that is different to the first etching process that is used to selectively remove part of the base material from the second surface of the base material, to remove the material that is resistant to the first etching process after the step of selectively removing at least a part of the base material.

4. A method of manufacturing a spectral purity filter according to claim 1, wherein said filling the trenches with a grid material comprises: depositing a layer of the grid material on the first surface of the base material such that the grid material enters the trench; and selectively etching the first surface of the base material such that grid material only remains within the trenches.

5. A method of manufacturing a spectral purity filter according to claim 3, wherein a protective cover layer is formed on the first surface of the base material after the trenches have been filled.

6. A method of manufacturing a spectral purity filter according to claim 5, wherein said using the second etching process is used to remove the protective cover layer.

7. A method of manufacturing a spectral purity filter according to claim 1, wherein the base material comprises monocrystalline silicon and said forming the trenches in the first surface of the base material comprises reactive-ion etching.

8. A method of manufacturing a spectral purity filter according to claim 2, wherein the material used to coat the surface of the trenches comprises silicon oxide, and wherein said selectively removing at least a part of the base material comprises reactive-ion etching.

9. A method of manufacturing a spectral purity filter according to claim 3, wherein the second etching process comprises plasma etching.

10. A method of manufacturing a spectral purity filter according to claim 1, further comprising coating at least one surface of the grid material after the apertures have been formed with a material that is reflective to the second type of radiation.

11. A method of manufacturing a spectral purity filter according to claim 1, wherein:

the trenches formed in first surface of the base material include the trenches corresponding to the walls to be formed between apertures of the spectral purity filter, which are in a first region of the first surface of the base material, and include trenches that extend into a second region of the first surface of the base material adjacent the first region; and said selectively removing at least part of the base material is configured such that the base material is removed from a region of the second surface of the base material corresponding to the first region of the first surface and not from a region of the second surface corresponding to the second region of the first surface.

12. A spectral purity filter manufactured according to the method of claim 1.

* * * * *